United States Patent [19]
Schneider et al.

[11] 4,094,009
[45] June 6, 1978

[54] STORAGE ARRANGEMENT WITH MODULES CONSISTING OF CCD STORES

[75] Inventors: Peter Schneider, Poecking; Ernst Goettler, Munich, both of Germany

[73] Assignee: Siemens Aktiengesellschaft, Berlin & Munich, Germany

[21] Appl. No.: 725,337

[22] Filed: Sep. 21, 1976

[30] Foreign Application Priority Data

Sep. 16, 1975  Germany .............................. 2543023

[51] Int. Cl.² .......................................... G11C 11/40
[52] U.S. Cl. ..................................... 365/183; 357/24; 365/238
[58] Field of Search .......................... 340/173 R, 172.5; 357/24

[56] References Cited

U.S. PATENT DOCUMENTS 3,763,480  10/1973  Wermer ........................... 340/173 R
3,772,658  11/1973  Sarlo ................................ 340/173 R Primary Examiner—Terrell W. Fears
Attorney, Agent, or Firm—Hill, Gross, Simpson, Van Santen, Steadman, Chiara & Simpson

[57] ABSTRACT

A storage arrangement for use with CCD storage devices, the storage area having an input shift register and an output shift register each of $m$ bits. $2m$ shift registers, each of length $n$ bits and constructed using the electrode-per-bit principle connect the input shift register to the output shift register. A circular shift register of length $n$ bits being connected to the gate input of $n$ switching transistors each of which is connected between a supply potential and one of $n$ pulse train lines of the storage area. A circulating charge in the circular shift register is the means whereby each one of the $n$ switching transistors cyclically connects one of the $n$ pulse train lines to the supply potential.

10 Claims, 8 Drawing Figures

STORAGE ARRANGEMENT WITH MODULES CONSISTING OF CCD STORES

BACKGROUND OF THE INVENTION

The invention relates to a storage arrangement with modules consisting of CCD stores.

CCD stores are known, for example, from the article "Charge Coupled Semiconductor Devices" in "The Bell System Technical Journal," 49, April 1970, pages 587-593. In Multi-phase CCD modules, the storage of one information bit requires at least two storage electrodes, and at any one time, the information bit is located beneath one of these electrodes. When shifted onwards, the information bit is moved under a second storage electrode which is not in use.

The storage positions are arranged in a series in the form of shift registers on the modules, and the individual shift registers are connected to one another in different ways. Here, first, two fundamental circuits are conceivable: In the one, the data transfer always occurs in one direction, e.g., from left to right, but this necessitates long line lengths in the event of the chaining of the shift registers either parallel to the channels with the storage positions or around the storage field. The other fundamental circuit means a zig-zag operation in which those ends of the shift registers which are adjacent one another are directly connected to each other, so that the data transfer takes place, e.g., from left to right in one shift register and from right to left in the underlying shift register. However, this necessitates a crossing over of the pulse train lines between adjacent shift registers, i.e., the actual storage surface is smaller with a constant module size.

These topographic disadvantages associated with the routing problems of pulse train drive devices have led to a different structure, the so-called series-parallel-series (SPS) arrangement which permits a higher store density. This arrangement is described, for example, in "The Journal of Vacuum Science and Technology," Vol. 9, No. 4, 1972, pages 1166-1180, in particular in Chapter XII, and is illustrated in FIG. 22.

In this known arrangement a CCD module in each case contains an input and an output shift register each with three electrodes per bit, and, correspondingly, three pulse trains. These pulse trains determine the data rate of the module. The items of data are transported in serial fashion in the shift registers. The actual storage area contains as many parallel shift registers as the input and output shift registers possess storage positions. From the serial input register, the items of data are transferred in parallel into the storage area and thus are displaced in parallel to the output shift register. This avoids cross-overs of pulse train lines which are unavoidable in a zig-zag arrangement in respect of the transfer direction.

The multi-phase principle which here too has been used throughout with at least two electrodes per bit does, however, require a large spatial outlay. Therefore, it has been attempted to find ways of realizing a structure comprising one electrode per bit, a so-called E/B principle. This can be achieved more or less by one blank space in each shift register, into which the preceding information is in each case transferred. Here, only one information bit can be displaced for each shift register during one pulse train period. The blank position travels through the shift register in the opposite direction to the information.

This arrangement has the disadvantage, however, that each storage position must be operated by an individual pulse train. This is due to the fact that the blank position must frequently circulate through all the storage positions of this shift register, until an arbitrary information bit has arrived at the write-read station.

A realization which enables a reduction in the number of individual pulse train lines, employing the E/B principle, is known from "IEEE International Solid State Circuits Conference 1973," pages 136, 137 and 210, which describes a so-called multiplex E/B principle, in which the homologous storage positions of the shift registers lying in parallel between input and output are operated cyclically exchanged. The requisite pulse train lines are led diagonally through the storage area and, therefore, are multiply exploited. However, the disadvantage occurs that it is either necessary to provide a separate pulse generator on each side of the storage area, or that the pulse train lines must be led around the storage area, which however, cannot be effected when the length of the shift register increases as the space requirement of the pulse train lines is too great.

Another solution is to realize the multiplex E/B principle in such a manner that the parallel shift register chains arranged on the CCD module are spatially displaced by one bit position. If the pulse train lines are then led through the parallel storage positions at right angles to the shift registers, and one blank position is provided in each row of the shift register chain, the individual pulse trains can be reduced. It is easy to conceive that this is a mixed form of the pure multi-phase principle and the E/B principle.

Therefore, this arrangement has the disadvantage that there are module surfaces which are not in use and which increase in size in accordance with the length of the individual shift registers in the chain, i.e., the more consistently the E/B principle is applied and the fewer blank positions are distributed among the storage positions in each column of the storage area. Another disadvantage consists in that here only square storage area arrangements can be effected, if it is desired to produce a closed loop on the module. For these reasons, it is not considered favorable to realize the multiplex E/B principle in the described manner.

Therefore, to summarize: Conventional modules of CCD stores constructed in accordance with the multi-phase principle require at least two storage electrodes to store one information bit, and at any one time, the information is located beneath one of these electrodes. By the introduction of the E/B principle it is possible to virtually double the store density on the module for example, in comparison to the two-phase principle, as then only one electrode is required for the storage of an information bit. However, position is additionally required in the shift register to receive the preceding item of information during the shift process. The E/B principle requires a separate pulse train for each individual electrode of a shift register. The space surface requirement of the pulse train lines cancels out the gain of surface space resulting from the E/B principle.

SUMMARY OF THE INVENTION

Therefore, the object of the present invention is to provide a storage arrangement with modules consisting of CCD stores, of the type described in the introduction, the construction of which storage arrangement allows the E/B principle to be used successfully, without the space requirement advantage being lost due to the individual pulse trains.

In a storage arrangement with modules consisting of CCD stores of the type described above, this aim is realized in accordance with the invention. The use of the E/B principle in a storage arrangement constructed in accordance with the SPS principle means that the full space saving is retained with the realization of the invention. In order to produce the individual pulse trains in a suitable fashion, in accordance with the invention, a shift register designed as a ring counter is provided in the form of a CCD or a multi-phase MOS shift register comprising $n$ storage positions which, as explained in detail, for example, in one of the further developments of the invention, operate $2n$ switching transistors which operate in pairs in push-pull and via which in each case one of the pulse train lines is cyclically connected to the operating voltage and the preceding pulse train line is discharged.

The space requirement for this pulse train generation is comparable to the space requirement for a conventional drive device in a SPS arrangement, as one pulse train only requires that the capacitance of one pulse train electrode be recharged. Therefore, the space requirement of the drive devices, and also their power loss no longer represents a great problem and, therefore, the shift registers which are arranged in parallel and are constructed in accordance with the E/B principle can readily be operated, for example, with a frequency of 10 MHz or more. Thus, it can be assumed that the storage density on a storage module designed in accordance with the invention is 100% greater than that in a conventional SPS arrangement operating in accordance with the two-phase principle, and nevertheless facilitates a data rate which is adequate for this type of store, with a low power loss. Further developments of the invention are characterized in detail in sub-claims.

Exemplary embodiments of the invention will be described in detail in the following in explanation of the invention.

DESCRIPTION OF THE PREFERRED EMBODIMENTS

Figure 1:
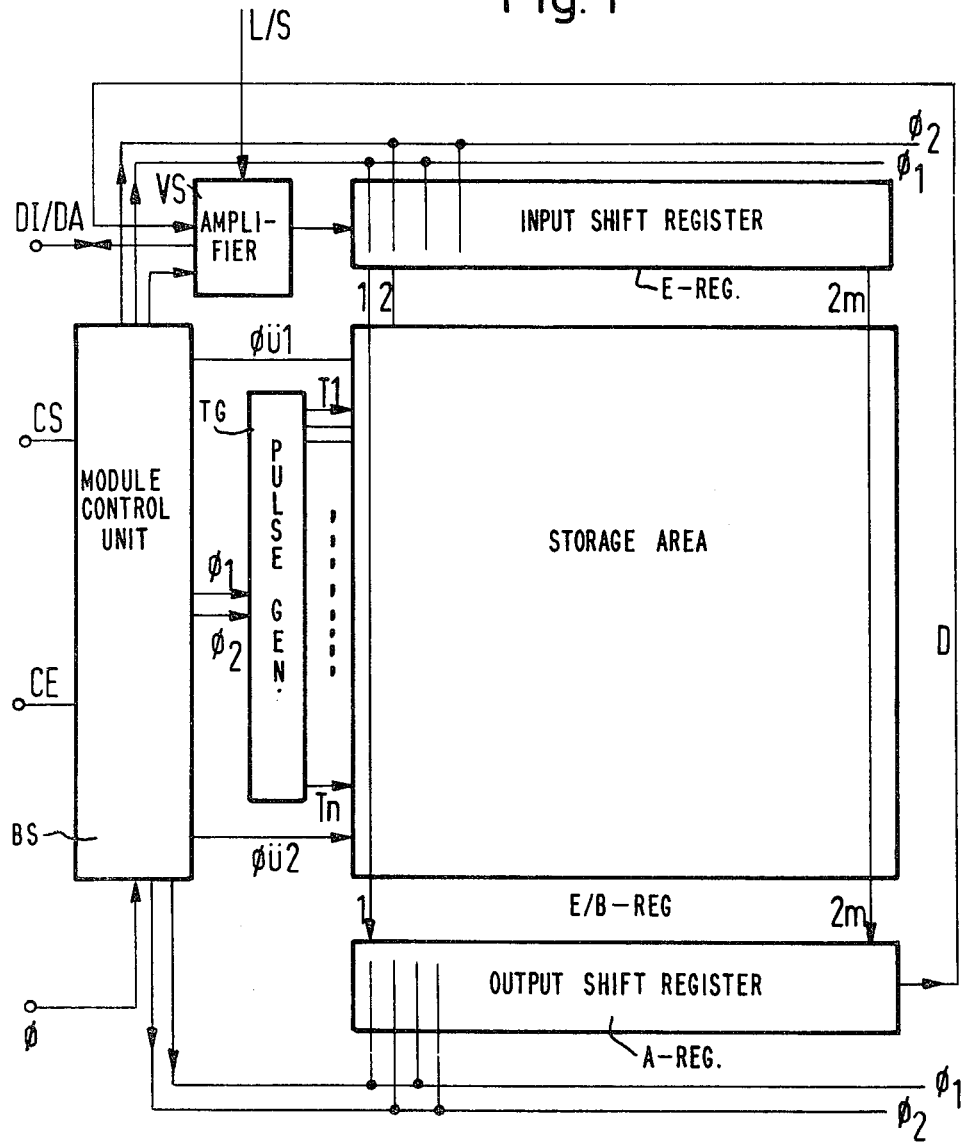
FIG. 1 is a block circuit diagram of a storage module with a SPS storage area, which operates in accordance with the electrode-per-bit principle, and is driven by a pulse generator containing a shift register.

FIG. 1 shows an integrated storage module, for example, CCD module with a SPS arrangement in which a storage area E/B-REG composed of a plurality of shift registers is arranged between an input shift register E-REG and an output shift register A-REG. If the input shift register E-REG and the output shift register A-REG each contain $m$ storage positions, the storage area E/B-REG contains $2m$ shift registers in parallel to one another, each of which are assigned to one storage electrode of the input and the output shift register. When each of these possess $n$ storage electrodes and operate in accordance with the so-called electrode-per-bit (E/B) principle, $n$ individual pulse trains are required for the parallel displacement of the information bits in the storage area.

These pulse trains are conducted to the individual homologous storage positions of the shift registers of the storage area E/B-REG via pulse train lines T1 to T$n$ from a pulse generator TG. As will be explained in detail further in the description, this pulse generator TG itself contains a shift register T-REG which, in the same way as the input shift register E-REG and the output shift register A-REG can be designed as a CCD module or a multi-phase shift register in the MOS technique. In the former case, these three shift registers are operated in serial fashion in two-phase operation and, therefore, require two pulse trains with which they are supplied via pulse train lines $\phi 1$ and $\phi 2$ for the operation of a storage cell.

The storage module also contains an amplifier station VS which is arranged at the input of the input shift register E-REG. This amplifier station serves as read/write station and also as so-called "refresh" station. For this purpose, the input of this amplifier station VS is connected to the output of the output shift register A-REG, but also exhibits a terminal DI/DA via which the data are input and output in serial fashion, and possesses a control signal input L/S for the supply of read and write control signals.

The storage module also contains, as conventionally, a module control unit BS which will not be explained here for this reason. This control unit is supplied via a pulse train line $\phi$ with a general pulse train from which are taken the pulse trains which are emitted on the pulse train lines $\phi 1$ and $\phi 2$. It also contains inputs which are referenced CS and CE via which it is supplied with a selector signal derived from address signals, and a release signal for the storage module.

Figure 2:
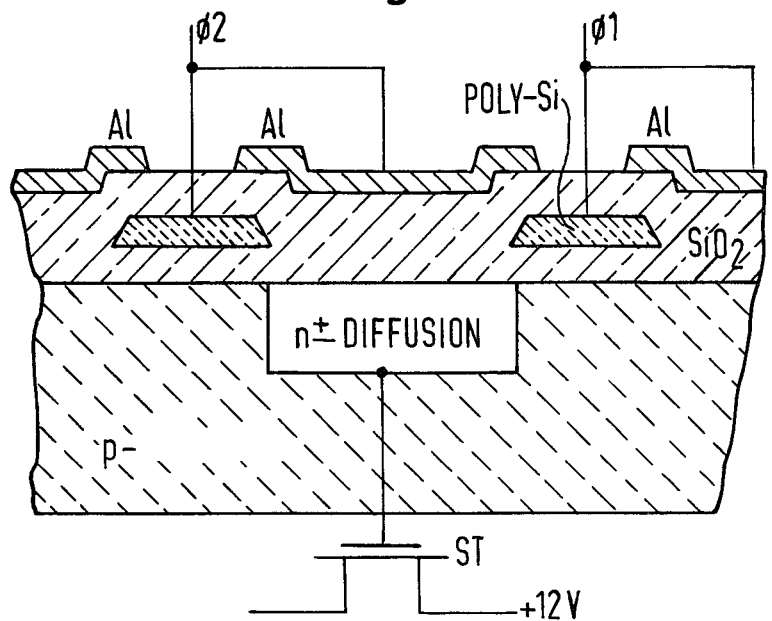
FIGS. 2 and 3 show two embodiments of a storage position in a CCD pulse train - shift register.
Figure 3:
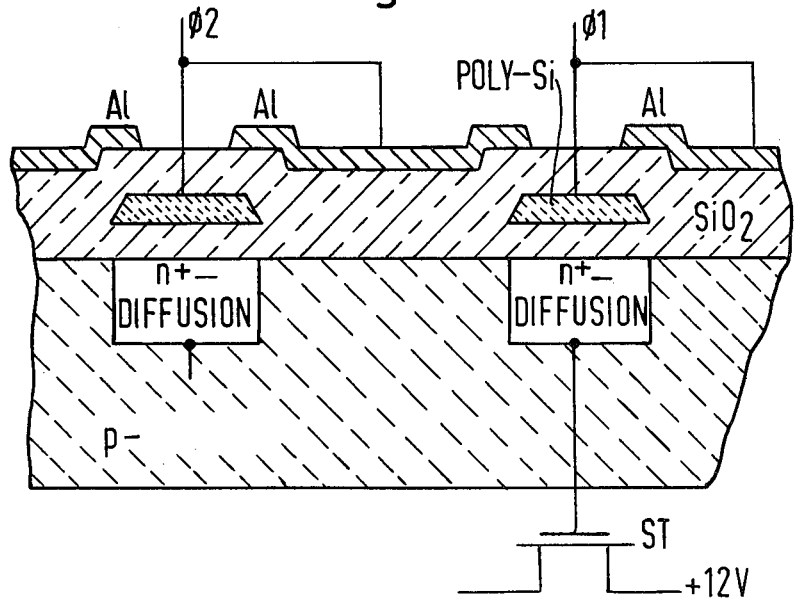

It has already been mentioned that the pulse generator TG itself contains a $n$-position shift register T-REG. FIG. 2 and FIG. 3 show two examples of how the storage positions of this shift register can be constructed. The shift register T-REG operates in accordance with the two-phase principle, and therefore, for the information transport each storage position must be supplied with two pulse train lines $\phi 1$ and $\phi 2$, which are alternately connected to the operating voltage. The design of a shift register in accordance with these two embodiments is already known from the article in "IEEE Journal of Solid-State Circuits," October 1973, pages 388 to 391, and, therefore, will only be summarized here.

The shift register is constructed on a p-substrate and in the channel zone contains a SiO$_2$ layer which on its upper side contains consecutive storage electrodes which consist of aluminum Al and polysilicon and are connected to the pulse train lines $\phi 1$ and $\phi 2$. Finally, an n-conducting diffusion zone is arranged beneath the aluminum part Al of the storage electrode on the surface of the p-substrate. This diffusion zone is itself connected to the control electrode of a switching transistor ST so that a charge in the diffusion zone renders the switching transistor ST conductive.

FIG. 3 shows a second embodiment for the construction of the pulse train register T-REG as CCD module. In contrast to the embodiment described above, here the diffusion zones are arranged beneath the silicon part of the electrodes. This arrangement is in fact technologically more difficult, but would possess the advantage that the output via the switching transistor ST would only be valid during a pulse train.

Figure 4:
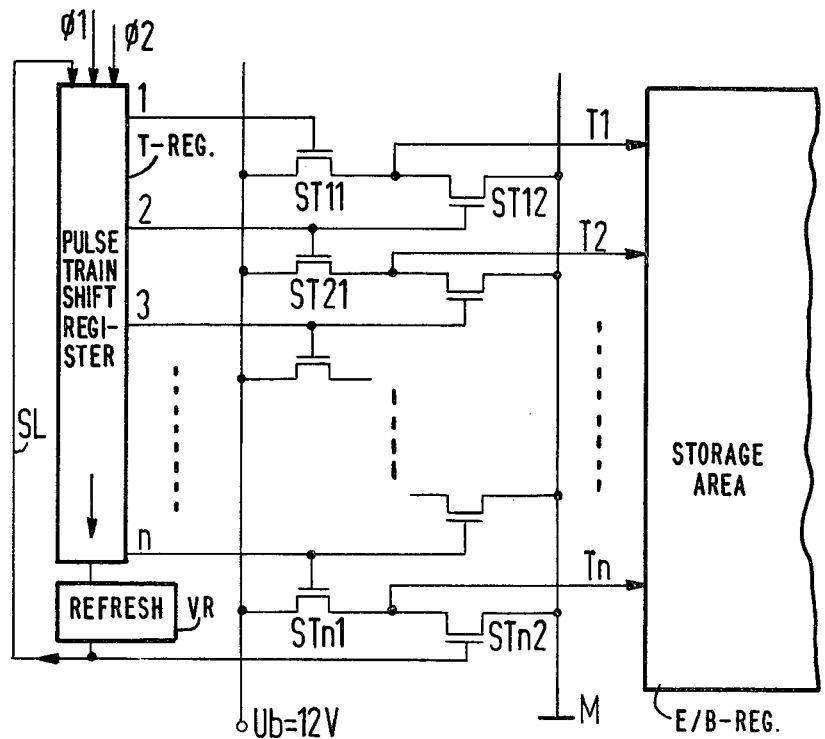
FIG. 4 is a fundamental circuit diagram of a pulse generator with a pulse train shift register which is constructed as CCD module and which drives the storage area with the shift registers operating in accordance with the E/B principle.

As the mode of operation of a CCD arrangement of this type is known in detail, in the following we shall immediately proceed to the description of the block circuit diagram, illustrated in FIG. 4, of the pulse train control unit with a CCD shift register. Here, the pulse train shift register T-REG is represented as a block in which the direction of shift is indicated by an arrow. At the output of the pulse train shift register T-REG is arranged an amplifier which serves as "refresh" station VR and whose output is connected via a loop line SL to the input of the pulse train shift register T-REG. Finally, the two pulse train lines $\phi 1$ and $\phi 2$ are also schematically illustrated.

The terminals, shown in FIG. 2 and FIG. 3, of the diffusion zones are here referenced 1 to $n$. Two consecutive outputs are each connected to the control electrodes of two switching transistors connected in push-pull, e.g., ST11 and ST12. The first of the two switching transistors operated in push-pull, ST11, is connected by its controlled electrodes to the operating voltage $Ub$ and to a pulse train line T1, whereas the second switching transistor ST12 is connected by its controlled electrodes to the pulse train line T1 and to earth M.

Such a pair of switching transistors connected in push-pull is arranged between each of the outputs 1 to $n$ of the pulse train shift register T-REG and one of the assigned pulse train lines T1 to T$n$. When the diffusion zone assigned to the output 1 receives the circulating charge in the pulse train shift register T-REG, as a consequence the connected switching transistor ST11 is rendered conductive and thus the pulse train line T1 is connected to the operating voltage $Ub$. After a pulse train period, the charge circulating in the pulse train shift register T-REG lies in the adjoining diffusion zone so that the two connected switching transistors ST12 and ST21 are operated. The one switching transistor discharges the first pulse train line T1, whereas the other simultaneously connects the operating voltage $Ub$ to the adjacent second pulse train line T2. Thus, an individual charge circulating in the pulse train shift register T-REG consecutively switches the various pulse train lines T1 to T$n$ of the storage area E/B-REG via the switching transistors to the supply voltage $Ub$. At the same time, the previous pulse train line is always discharged via the associated push-pull stage.

The pulse generator consisting of the pulse train shift register T-REG and the 2$n$ switching transistors ST$n$1 and ST$n$2 is of comparable size to the driver transistor which supplies the pulse train for a storage area in a conventional SPS arrangement with multi-phase operation, so that the gain in surface space offered by the use of the E/B principle in the storage area is fully retained. The small surface space requirement of this pulse generator arrangement is due, for example, to the fact that it is only necessary to recharge the capacitance of one pulse train electrode for one pulse train. Therefore, the size of the switching transistors and also the power loss does not represent a problem. This also means that the shift registers in the storage area E/B-REG can be operated with a high shift frequency, for example, more than 10 MHz, i.e., the blank position circulates at this frequency.

From the point of view of structure, the described pulse train generation for the storage area E/B-REG is attractive as a standard technology is used. However, this technology subjects the production technique to very high requirements. Therefore, currently it is preferred to use CCD modules of somewhat simpler construction for the storage area E/B-REG, the production technology in respect of which can be easily handled, and to effect the pulse train generation in a different circuitry technique. For this purpose, the MOS technique can be used which is now so advanced that circuits can be designed in this technique with computer assistance. In this case, the pulse generator TG will be constructed in the form of a MOS shift register.

Figure 5:
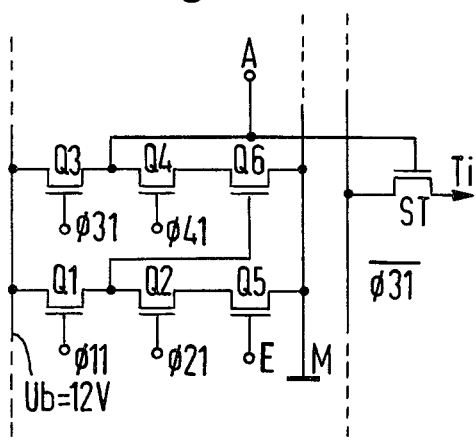
FIG. 5 illustrates one storage position of a 4-phase shift register in the MOS technique.

FIG. 5 illustrates the storage position of a four-phase MOS shift register which is suitable for this purpose. Shift registers of this type are known in all details, for example, from "The Electronic Engineer," March 1970 pages 59 to 73, and, therefore, here FIG. 5 will merely be explained briefly. The storage position consists of two inverter stages which each consist of three series-connected MOS transistors Q1, Q2, Q5 and Q3, Q4 and Q6, arranged between the operating voltage $Ub$ and earth M. The control electrode of the first MOS transistor Q5 connected to earth M forms the input E and the connection point between drain and source of the two series-connected MOS transistors Q3 and Q4 of the second inverter forms the output A of the storage position. Likewise, the control electrode of the third MOS transistor Q6 of the second inverter forms the latter's input, which is connected to the drain and source of the two pulsed MOS transistors Q1 and Q2 of the first inverter. In each case, two MOS transistors Q1, Q2 and Q3, Q4 of the two inverters are supplied with the pulse trains $\phi 11$, $\phi 21$, $\phi 31$, and $\phi 41$.

Figure 6:
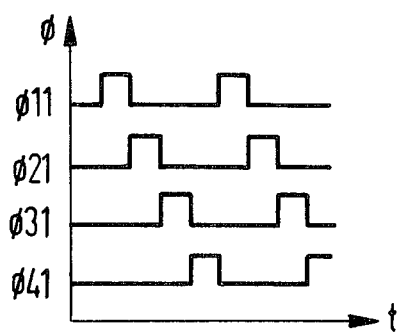
FIG. 6 is a diagram of the non-overlapping pulse trains required for this shift register.

The phase state of these pulse trains is shown in a diagram in FIG. 6, from which it can be seen that this MOS shift register is controlled with non-overlapping pulse trains, this being necessary to avoid the operating voltage $Ub$ being occasionally directly connected to earth M.

At the pulse train time $\phi 11$, the gate capacitance of the third MOS transistor Q6 in the second inverter is charged via the first MOS transistor Q1, which has been driven conductive, of the first inverter, and at the pulse train time $\phi 21$ is discharged again via the second MOS transistor Q2 which has been driven conductive, when the gate capacitance of the third transistor Q5 in the first inverter has likewise been charged. If, however, this input E of the storage position has not been operated, the third transistor Q6 in the second inverter also remains conductive. At the pulse train time $\phi 31$, that gate electrode of the next storage position which has not been shown here and has been connected to the output A, is charged via the first MOS transistor Q3 of the second inverter and at the pulse train time $\phi 41$ is discharged via the two MOS transistors Q4 and Q6 when the latter has been driven conductive. FIG. 5 also indicates that the output of this storage position is connected to the control electrode of a control transistor ST which forms the drive device for a pulse train line T$i$ and whose drain is connected to pulse train $\overline{\phi 31}$.

Figure 7:
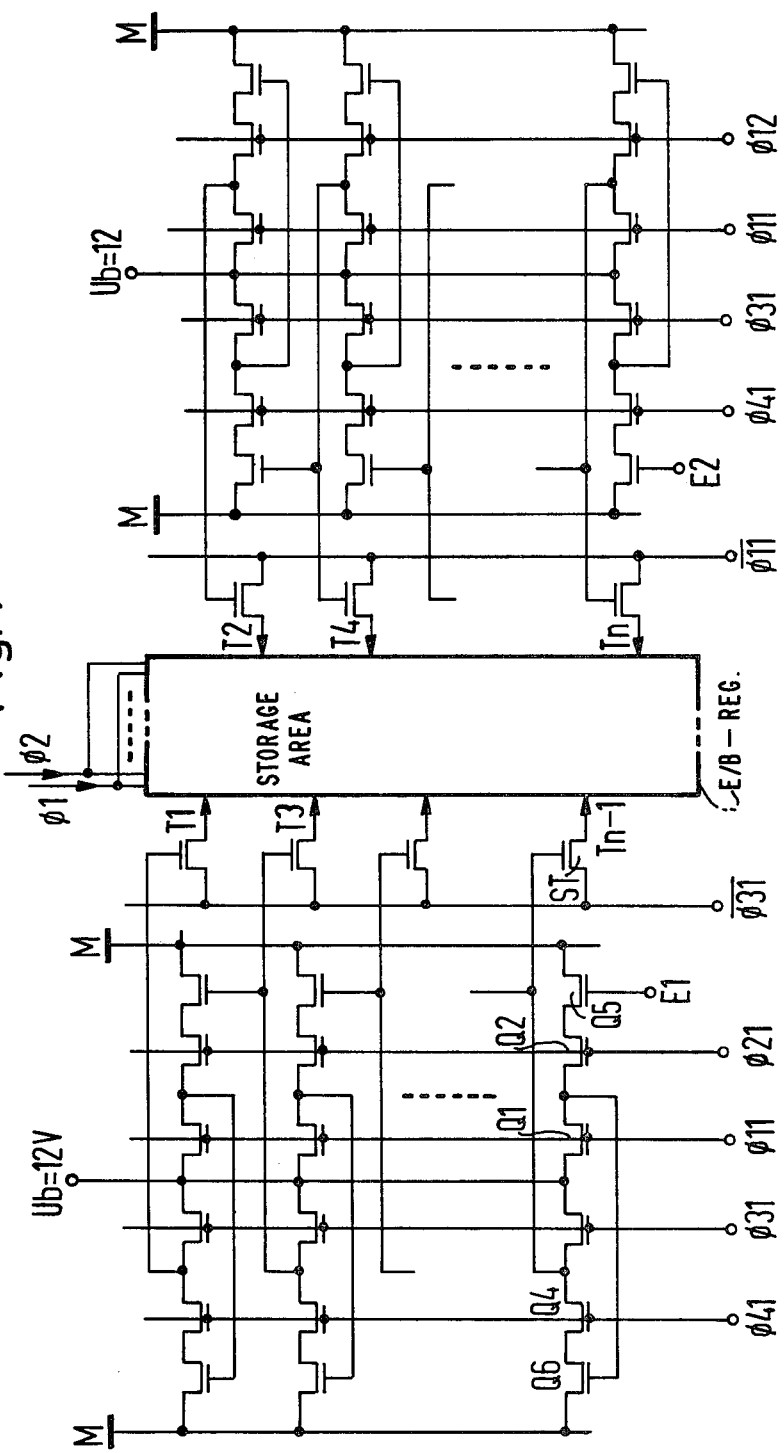
FIG. 7 is a fundamental circuit diagram of a pulse generator for driving a E/B storage area which is constructed from 4-phase MOS shift registers.

FIG. 7 illustrates an arrangement in which the storage area E/B-REG is assigned a pulse generator TG in the MOS technique. As will be seen from comparing FIG. 5 with FIG. 7, the four-phase MOS shift register which, in order to match the pattern in the storage section E/B-REG is arranged half on each side of the latter, is constructed from the storage positions which have been explained in detail with reference to FIG. 5. The following rows of the storage area E/B-REG, considered from the bottom upwards, are fed with shift pulses alternately from the right and from the left via the pulse train lines T$i$. This is effected in that in each half of the MOS shift register a singular "1" is transported from storage position to storage position. To effect this in the correct time slot pattern, both halves of the MOS shift register operate phase-displaced by one half pulse train period. However, this results in no charge in the fundamental mode of operation which has been explained with reference to FIG. 5.

In order that all the information bits of these described storage arrangements can now be conducted once past the amplifier station VS illustrated in FIG. 1, in a refresh cycle, a frequent circulation of the blank row in the parallel shift registers of the storage area E/B-REG is necessary. The same naturally also applies to the access to a specific informaiton bit in read and write processes which are also carried out via this amplifier station.

Figure 8:
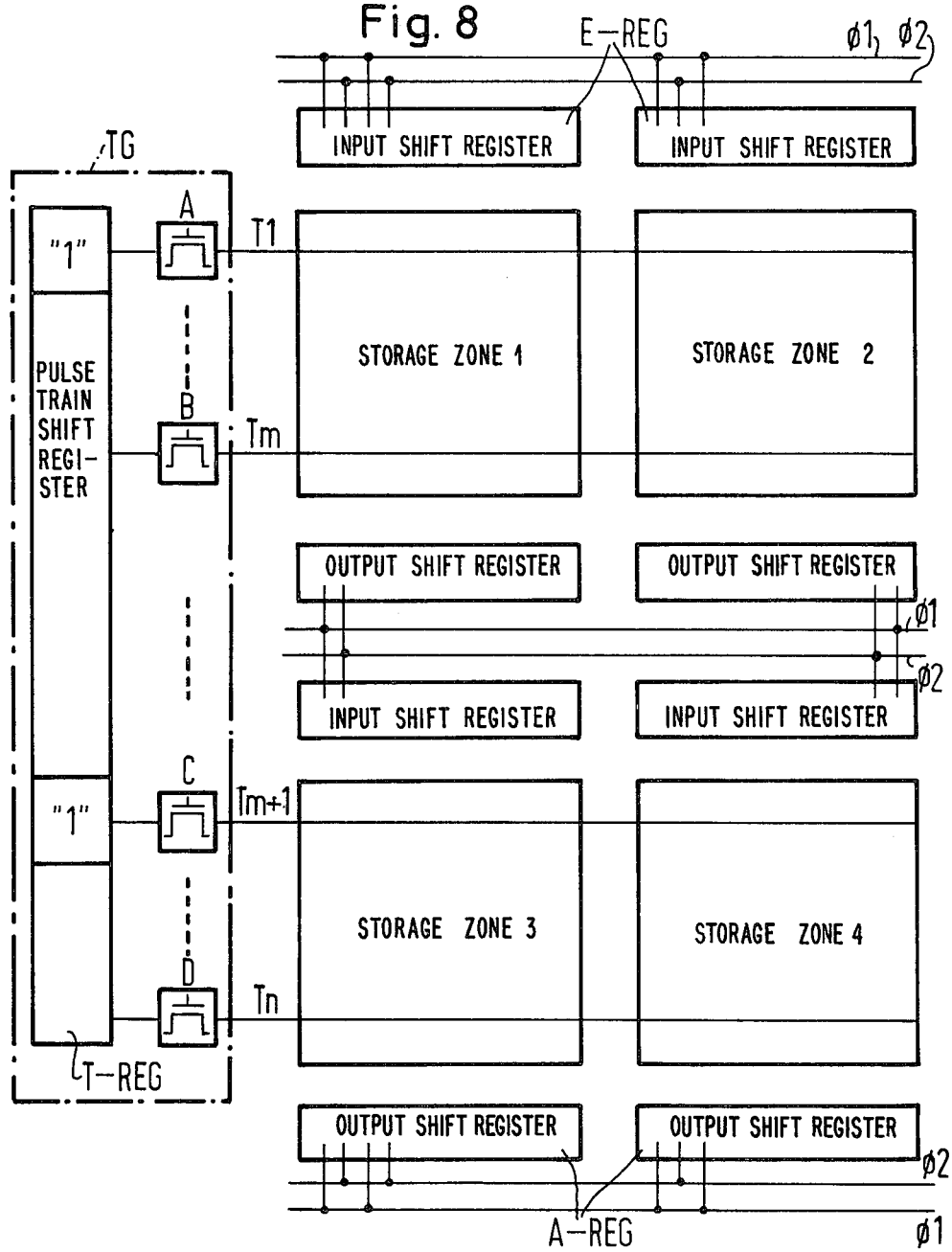
FIG. 8 is the block circuit diagram of a store module in which the storage area is divided into a plurality of, in this case four, SPS arrangements.

This period of time for a refresh cycle, and the average access time can be reduced if a storage arrangement as illustrated in FIG. 8 is selected. Here, the storage area is divided into four storage zones each of which contain a SPS arrangement of the previously described type, but with a smaller capacity. Each of these storage zones E/B-REG1 to E/B-REG4 possesses a separate input and output shift register E-REG and A-REG, respectively. The output shift register and input shift register of storage zones arranged one beneath another are here connected to one another. On the other hand, the pulse train lines T1 to T$n$ are led through the storage zones arranged next to one another.

Even when the storage area is divided into a plurality of storage zones, the pulse generation comprises only one single pulse generator TG. As indicated in FIG. 8, in the controlling pulse train shift register T-REG, charges circulate at a pluraltiy of positions, and in fact spaced precisely by the length of one storage zone. One charge is in each case responsible for the pulse train generation of all the storage zones arranged next to one another. In this example, four control transistors as shown in FIG. 8 and four push-pull stages as shown in FIG. 4 are designated A, B, C and D. In the case of the storage zones arranged beneath one another, which have been selected as an example, at a specific time only two of these pulse train stages, here, for example, A and C, are ever switched through. This division of the storage area into a plurality of storage zones requires only a small additional space requirement as a result of the division. As can easily be seen, the reduction in the average access time of this arrangement is dependent upon the nature of the division and the size of the individual storage zones. It can easily be seen that the access time and also the time required for a refresh cycle can, with this division, be several degrees shorter than in the case of an undivided storage area of equal capacity.

Therefore, due to the shortened access time, a store constructed from modules of this type can readily be used as main store in a virtual storage system. When a suitable division is provided, the circulation time can be reduced to such an extent that a storage module can also be operated in accordance with the start-stop principle. If then, addressable read-out facilities for every individual information bit of a data chain are incorporated into the output shift registers — similarly as has been described in the above case for the pulse train shift register — such a storage module is also highly suitable for use in transparent multi-stage working store systems, as then the output shift register as a whole can then be used as a hierarchy stage.

It will be apparent to those skilled in the art that many modifications and variations may be effected without departing from the spirit and scope of the novel concepts of the present invention.

We claim as our invention:

1. A storage arrangement suited for use with CCD stores comprising a CCD storage area having a series-parallel-series arrangement of data flow in which 2$m$ parallel shift registers each of length $n$ bits are arranged between an input shift register and an output shift register each being of length $m$ bits; said 2$m$ parallel shift registers being constructed with one storage electrode for each storage location using the electrode-per-bit principle; a circular pulse train shift register having a length of $n$ storage locations with said $n$ bits of said circular pulse train shift register each being connected to the gate termial of one of $n$ switching transistors, each of said switching transistors having a first input connected to a supply potential and a second input connected to one of $n$ pulse train lines of said storage area; a circulating charge in said circular shift register being the means whereby each one of said $n$ switching transistors cyclically connects one of said $n$ pulse train lines to said supply potential.

2. A storage arrangement according to claim 1, wherein said pulse train shift register comprises a CCD shift register with each second storage electrode possessing a diffusion zone in the substrate; the control electrodes of a first and second switching transistor being connected to said diffusion zone, a first input to said first transistor being connected to a first of said pulse train lines and a first input to said second transistor being connected to a second of said pulse train lines; said first and second pulse train lines being successively connected to said storage area; a second input of said first transistor being connected to a reference potential and a second input of said second transistor being connected to a supply potential; said first and second transistors being operated in a push-pull mode whereby when said first transistor conducts and connects said reference potential to said first previously charged pulse train line discharging said first pulse train line said second transistor conducts and connects said supply potential to said second pulse train line charging said second pulse train line.

3. The storage arrangement according to claim 2, wherein said pulse train shift register comprises shift register having each of the diffusion zones arranged beneath the silicon part of the storage electrode.

4. The storage arrangement according to claim 2, wherein said pulse train shift register comprises a shift register having each of the diffusion zones arranged beneath the aluminum part of the storage electrode.

5. The storage arrangement according to claim 1, wherein said pulse train shift register comprises a four-phase MOS shift register such that each storage location has a first inverter with an output connected to the input of a second inverter; said first and second inverters each having three MOS transistors arranged in series between a reference potential and a ground potential; the output of said second inverter being connected to the control electrode of a control transistor; said control transistor having a first input connected to a source of control potential and a second input connected to one of said pulse train lines of said storage area.

6. A storage arrangement according to one of claims 1 the storage area comprising at least two storage areas each having a series-parallel-series arrangement of data flow and each operating in accordance with the electrode-per-bit principle.

7. A storage arrangment according to claim 6, said storage means being arranged one beneath the other and said pulse train shift register having one circulating charge for each of said storage areas; said circulating charges being spaced to properly switch said $n$ pulse train lines.

8. The storage arrangement according to claim 7, said storage areas being arranged beneath one another and parallel to one another and said pulse train lines being through-connected transversely across said parallel storage areas.

9. A storage arrangement suited for use with CCD stores comprising a CCD storage area having a series-parallel-series arrangement of data flow in which $2m$ parallel shift registers each of length $n$ bits are arranged between an input shift register and an output shift register each being of length $m$ bits; said $2m$ parallel shift registers being constructed with one storage electrode for each storage location using the electrode-per-bit principle; a circular pulse train shift register having a length of $n$ storage locations with said $n$ bits of said circular pulse train shift register each being connected to the gate terminal of one of $n$ switching transistors, each of said switching transistors having a first input connected to a supply potential and a second input connected to one of $n$ pulse train lines of said storage area; a circulating charge in said circular shift register being the means whereby each one of said $n$ switching transistors cyclically connects one of said $n$ pulse train lines to said supply potential, said pulse train shift register comprising a CCD shift register with each second storage electrode possessing a diffusion zone in the substrate; the control electrodes of a first and second switching transistor being connected to said diffusion zone, a first input to said first transistor being connected to a first of said pulse train lines and a first input to said second transistor being connected to a second of said pulse train lines; said first and second pulse train lines being successively connected to said storage area; a second input of said first transistor being connected to a reference potential and a second input of said second transistor being connected to a supply potential; said first and second transistors being operated in a push-pull mode whereby when said first transistor conducts and connects said reference potential to said first previously charged pulse train line discharging said first pulse train line said second transistor conducts and connects said supply potential to said second pulse train line charging said second pulse train line.

10. A storage arrangement according to claim 9, the storage area comprising at least two storage areas each having a series-parallel-series arrangement of data flow and each operating in accordance with the electrode-per-bit principle.

* * * * *